(12) United States Patent
Colongo et al.

(10) Patent No.: US 8,441,802 B2
(45) Date of Patent: May 14, 2013

(54) BASE FOR AN ELECTRONIC CARD AND ASSOCIATED EXTRACTION DEVICE

(75) Inventors: Emile Colongo, Montesquieu Volvestre (FR); Olivier Roujean, Toulouse (FR)

(73) Assignee: Airbus Operations (SAS), Toulouse (FR)

( * ) Notice: Subject to any disclaimer, the term of this patent is extended or adjusted under 35 U.S.C. 154(b) by 175 days.

(21) Appl. No.: 13/033,957

(22) Filed: Feb. 24, 2011

(65) Prior Publication Data

US 2011/0212637 A1 Sep. 1, 2011

(30) Foreign Application Priority Data

Feb. 24, 2010 (FR) ...................................... 10 51325

(51) Int. Cl.
*H05K 5/00* (2006.01)
(52) U.S. Cl.
USPC .......................................... 361/754; 439/160
(58) Field of Classification Search .................. 439/160, 439/377; 361/754
See application file for complete search history.

(56) References Cited

U.S. PATENT DOCUMENTS

| | | | |
|---|---|---|---|
| 6,246,585 B1 | 6/2001 | Gunther et al. | |
| 6,317,967 B1 | 11/2001 | Sampson | |
| 6,515,866 B2 * | 2/2003 | Ulrich | 361/759 |
| 6,579,029 B1 | 6/2003 | Sevde et al. | |
| 6,955,550 B2 * | 10/2005 | Schlack | 439/160 |
| 7,322,840 B2 * | 1/2008 | Sunaga et al. | 439/160 |
| 2003/0172523 A1 | 9/2003 | Joist et al. | |
| 2007/0111574 A1 | 5/2007 | Oila | |
| 2007/0236899 A1 | 10/2007 | Dalisay | |
| 2009/0000117 A1 | 1/2009 | Oila | |

OTHER PUBLICATIONS

French Preliminary Search Report issued Oct. 7, 2010, in French 1051325, filed Feb. 24, 2010 (with English Translation of Categories of Cited Documents).

* cited by examiner

*Primary Examiner* — Hae Moon Hyeon
(74) *Attorney, Agent, or Firm* — Oblon, Spivak, McClelland, Maier & Neustadt, L.L.P.

(57) ABSTRACT

A base for an electronic card includes at least one slot adapted for accommodating an electronic card with an extraction lever installed rotatably in relation thereto and adapted for pivoting between a first position and a second position. The lever has a support end adapted for coming to rest on a support element of the base in order to extract the electronic card from the base when the lever changes from the first to the second position. The support element has a first state in which the extraction lever does not bear on the support element when changing from the first position to the second position, and a second state, in which the lever bears on the support element when changing from the first to the second position. This creates a movement for extraction of the card through the support end along a support direction.

12 Claims, 4 Drawing Sheets

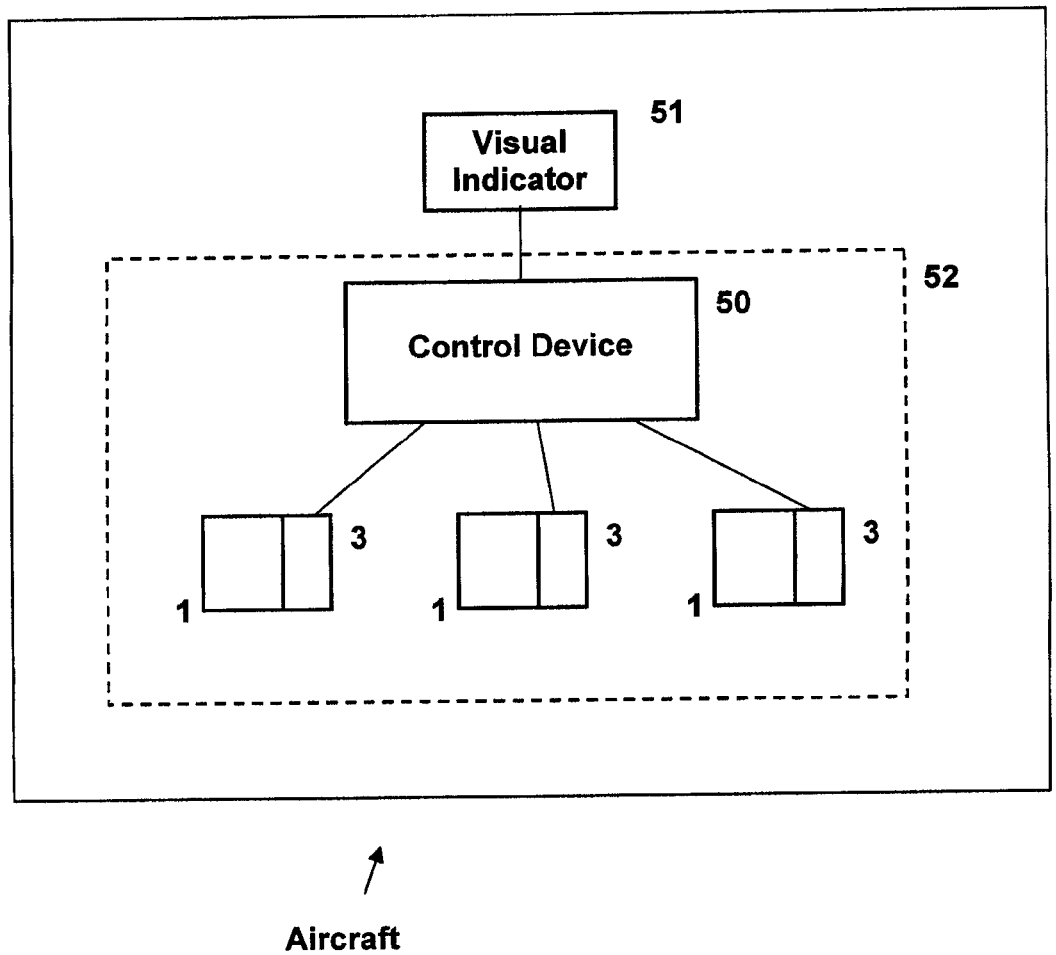

BASE FOR AN ELECTRONIC CARD AND ASSOCIATED EXTRACTION DEVICE

TECHNICAL FIELD

This invention relates in general to electronic card extractors.

More particularly, this invention relates to electronic card extractors for avionic equipment items of an aircraft.

BACKGROUND

The avionic equipment items of an aircraft are made up of computers having the form of electronic cards installed in units or cabinets, connected to the electrical bundle of the aircraft. In practice, the electronic cards are installed by one of their edges into a slot provided for this purpose on a base installed in a unit. The back of the unit has a plurality of connectors disposed perpendicular to the base, so as to connect electrically the electronic cards installed on the base by an edge perpendicular to and immediately adjoining the edge installed in the slot of the base.

Usually, in a standard device comprising electronic cards, in order to remove an electronic card it is necessary to make sure to have cut off the electrical supply of the electronic card in order to avoid any damage to the electronic components before actuating the extractor in order to extract the card.

In avionic equipment items, there are modular equipment items wherein one of the sought objectives is to retain the availability of various avionic functions even when a given electronic card is removed. In concrete terms, it is a matter of being able to remove cards independently of one another and to see to it that the equipment is able to provide a given function despite the absence of one or more electronic cards.

In practice, in order to extract an electronic card, the operator sends out an extraction request on a central computer for a given card. The other cards then are reconfigured in order to be able to function without the chosen card and the power supply of the latter is cut off. A visual indicator tells the operator that he may extract the card.

Nonetheless, the risk remains that the operator will not remove the card on which the extraction request has been implemented, but another card. An erroneous extraction may damage the card in question. In addition, malfunctions of the system may occur since the system has not been reconfigured to operate without the card extracted by error.

The problem thus is to make extraction of the card subject to the modular preparation of the other electronic cards and to the cutoff of current thereto.

More generally, the problem therefore is to prevent incorrect or erroneous extractions of the electronic cards.

In order to be extracted, the cards are provided with extractors in the form of a lever making it possible to reduce an extraction force applied on the lever in order to contribute toward extracting the card.

In fact, the evolution of the number of components on the electronic cards led to the increase of the number of contacts between the cards and their connectors. The contact pressure on each of the cards is such that it is necessary to provide an extractor. In practice, an extraction may require a force ranging up to 350 N. It is understood that without the aid of an extractor, it is impossible to extract the card.

SUMMARY

Based on these observations, the invention proposes a base for an electronic card comprising at least one slot adapted for accommodating an electronic card with an extraction lever installed rotatably in relation thereto and adapted for pivoting between a first position and a second position, the lever having a support end adapted for coming to rest on a support element of the base in order to extract the electronic card from the base when the lever changes over from the first to the second position, the support element having a first state in which the extraction lever does not bear on the support element when changing over from the first position to the second position, and a second state, in which the lever bears on the element when changing over from the first to the second position, the rotation of the lever from the first position to the second position then bringing about a movement for extraction of the card through resting of the support end of the lever on the support element along a support direction.

The invention thus proposes to make the support surface for the extraction lever inoperative, so as to make the latter inoperative through lack of support surface when that is necessary. In other words, since the efficacy of the lever is dependent on the presence of a support surface, the fact of making the latter inoperative prevents activation of the lever and therefore stands in the way of any erroneous extraction of the card.

This ensures a greater reliability during maintenance operations.

According to one possible advantageous characteristic of the invention, the support element is installed free in translation along the support direction, and the changeover from the first to the second state is accomplished by a mechanical blockage of the support element in translation in a position in which the support end of the lever bears on the said element during rotation of the lever from the first position to the second position, then bringing about a movement for extraction of the card.

In this way, the number of mechanical parts in motion advantageously is limited.

According to possible advantageous characteristics of the invention, combined if need be:

the support element is movable between a first position in which it is not in the path of the support end of the lever when the latter changes over from its first to its second position, and a second position in which the support element is in the said path of the support end of the lever, the changeover from the first to the second state being accomplished by a movement and a mechanical blockage of the support element from the said first position to the said second position;

the support element is movable in translation along the support direction;

the support element is movable along a direction more or less perpendicular to the support direction;

the mechanical blockage is accomplished with the aid of an electromagnet.

According to another aspect, the invention relates to an extraction device comprising at least one electronic card having a lever having a support end adapted for coming to rest on a support element and a base such as described above.

According to an advantageous aspect, the extraction device comprises visual means indicating that the support element is in the second state.

According to another aspect, the invention relates to an electronic card extraction device comprising a plurality of interconnected cards and control means adapted for:

receiving an extraction request for a given card,
reconfiguring the other cards so as to provide the function or functions of the card to be extracted, sending a signal to the support element of the selected card to change over from the first to the second state, indicating by a visual indicator that the card is ready to be extracted.

According to another aspect, the invention relates to a method for extraction of an electronic card with the aid of an extraction device such as described above, comprising the following steps:

sending out an extraction request for a given card, identifying with the aid of the visual indicator that the card is ready to be extracted, extracting the card by causing the lever to change over from the first to the second position.

According to another aspect, the invention relates to an aircraft equipped with a base and/or an extraction device and/or a control device such as described above.

BRIEF DESCRIPTION OF THE DRAWINGS

The explanation of the invention now will be continued with the detailed description of two exemplary embodiments, given below by way of illustration and non-limitative, with reference to the attached drawings. Thereon:

FIG. 5 is a schematic view of a control device connected to a plurality of bases and cards.

DETAILED DESCRIPTION

Generally speaking, the same numerical references are used in the description of the attached Figures for identical or similar elements.

Figure 1A:
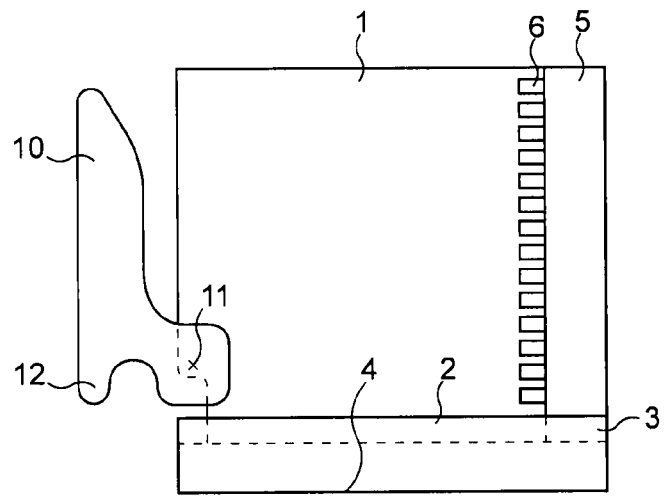
FIGS. 1a to 1c show the operating principle of an extraction lever for an electronic card in general.
Figure 1B:
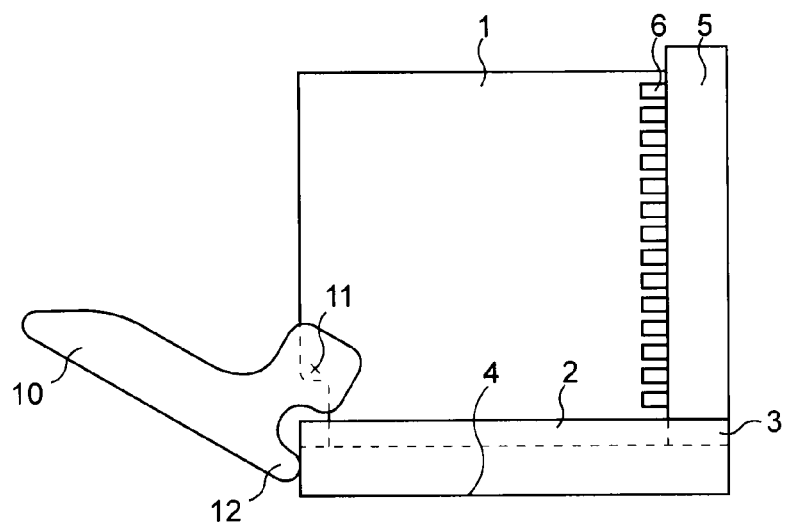
Figure 1C:
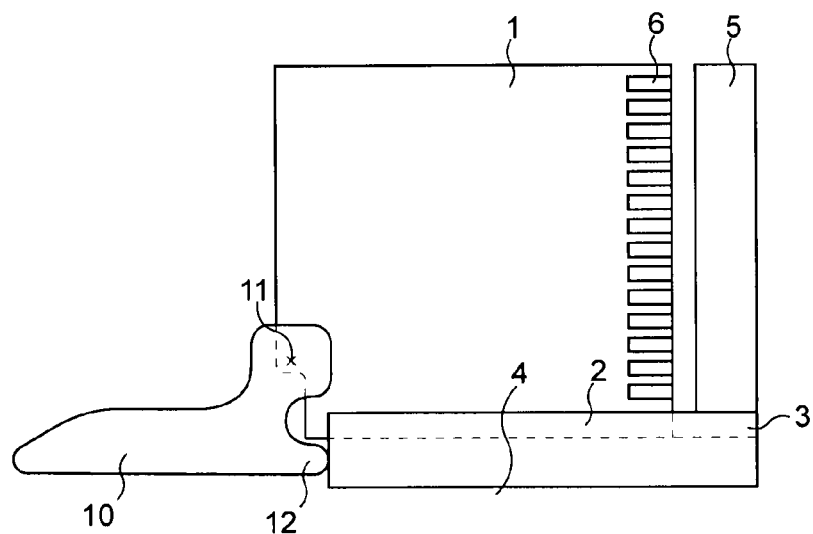

FIGS. 1a, 1b and 1c schematically show in a side view an electronic card 1 installed by its lower edge in a slot 2 provided for this purpose in a base 3 installed in a unit 4. The back of unit 4 has a connector 5 disposed perpendicular to the base in the same plane as slot 2 so as to connect electrically the electrical contacts of the electronic cards disposed on an edge perpendicular to and immediately adjoining the edge installed in the slot of the base.

On FIGS. 1a to 1c the electrical contacts of card 1 have been shown, the other cards, not visible, being installed in the same way.

Card 1 has, at the end opposite electrical contacts 6, a lever 10 installed rotatably on card 1 through a pivot 11 perpendicular to the card and to the longitudinal direction of the latter.

As visible more particularly on FIGS. 1b and 1c, when the lever is pivoted around pivot 11 from a first position (FIG. 1a) to a second position (FIG. 1c), a support end 12 of the lever bears on an exterior face of base 3 forming a support surface, reducing the force applied to the opposite end of the lever in order to convert it into a force for extraction of the card from its connector 5.

The contact forces between contacts 6 and connector 5 are such that the use of an extraction lever 10 is necessary in order to extract card 1 from connector 5. The invention benefits from this finding by proposing to provide or not provide a support surface for the lever, in this way allowing or precluding extraction of the card.

Figure 2A:
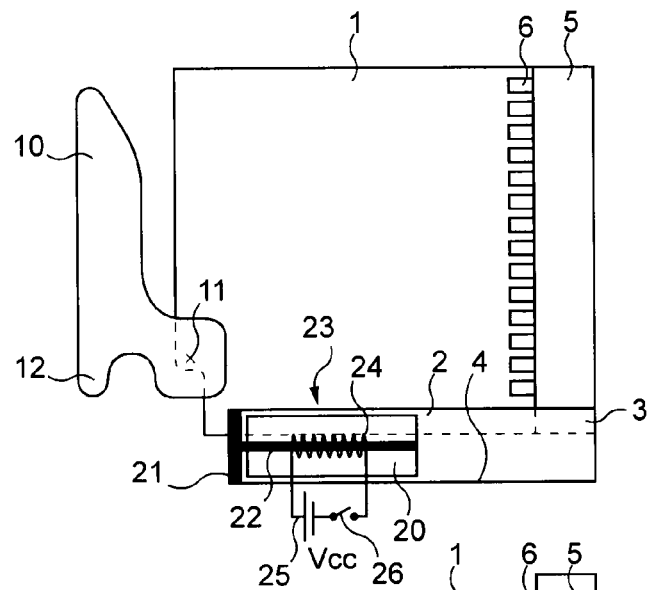
FIGS. 2a to 2c show the operating principle of an extraction lever for an electronic card according to the invention.
Figure 2B:
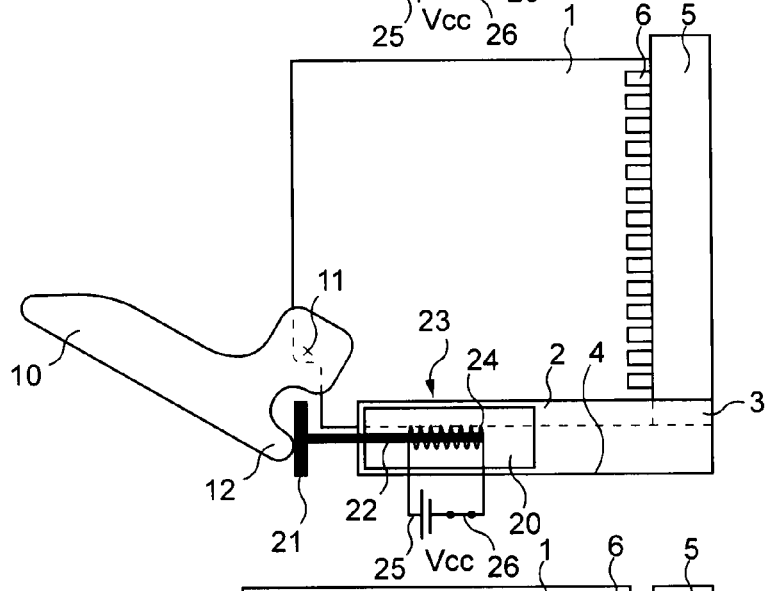
Figure 2C:
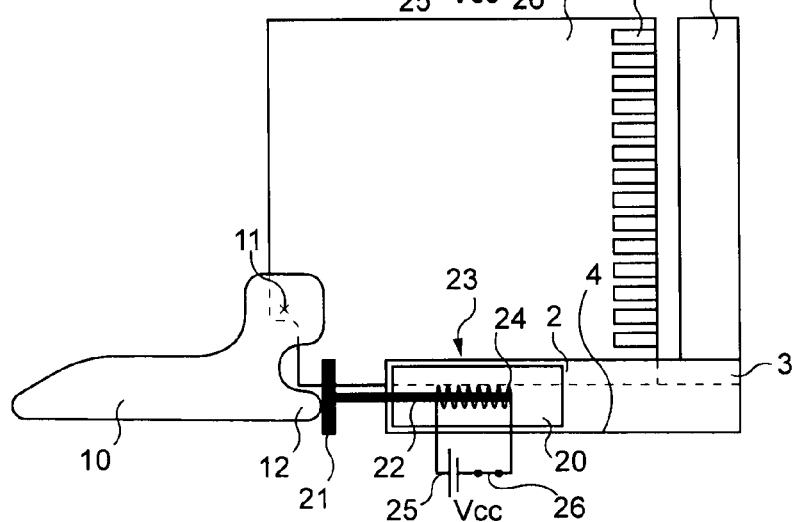

A first embodiment of an extraction device according to the invention is visible on FIGS. 2a to 2c. According to the same mechanical principle as on FIGS. 1a to 1c, the extraction device comprises an extraction lever 10 for electronic card 1 installed along pivot 11 in relation to the card, so that it may pivot between a first position and a second position. The movement for extraction of the card is dependent on the presence of a support surface for the support end 12 of the lever.

As visible on FIGS. 2a to 2c, the base according to the invention has a support device 20. The latter comprises a support plate 21 integral with a rod 22 at least partially ferromagnetic and installed translatably in base 3 between a first retracted position such as visible on FIG. 2a and a second position referred to as support such as visible on FIGS. 2b and 2c. Translation from the first position to the support position is controlled by an electromagnet 23 composed of the ferromagnetic part of rod 22 on which there is installed an electrical coil 24 supplied by an electrical circuit 25 subjected to a DC voltage. Circuit 25 may be interrupted with the aid of a switch 26. The ferromagnetic part of rod 22 and coil 24 jointly form an electromagnet.

When switch 26 is closed, coil 24 generates an electromagnetic field acting on the ferromagnetic part of rod 22, thus causing it to change over from the retracted position visible on FIG. 1 to the support position visible on FIG. 2b in which support plate 21 is moved forward so that support end 12 of lever 10 bears on the support plate. Lever 10 then brings about a movement for extraction of the card during its rotation around pivot 11 as visible on FIG. 2c.

In this way, advantageously, since the extraction of the card is dependent on the presence of the support surface for lever 10, any untimely extraction is prevented as long as support element 21 is not in the second position referred to as support.

Figure 3:
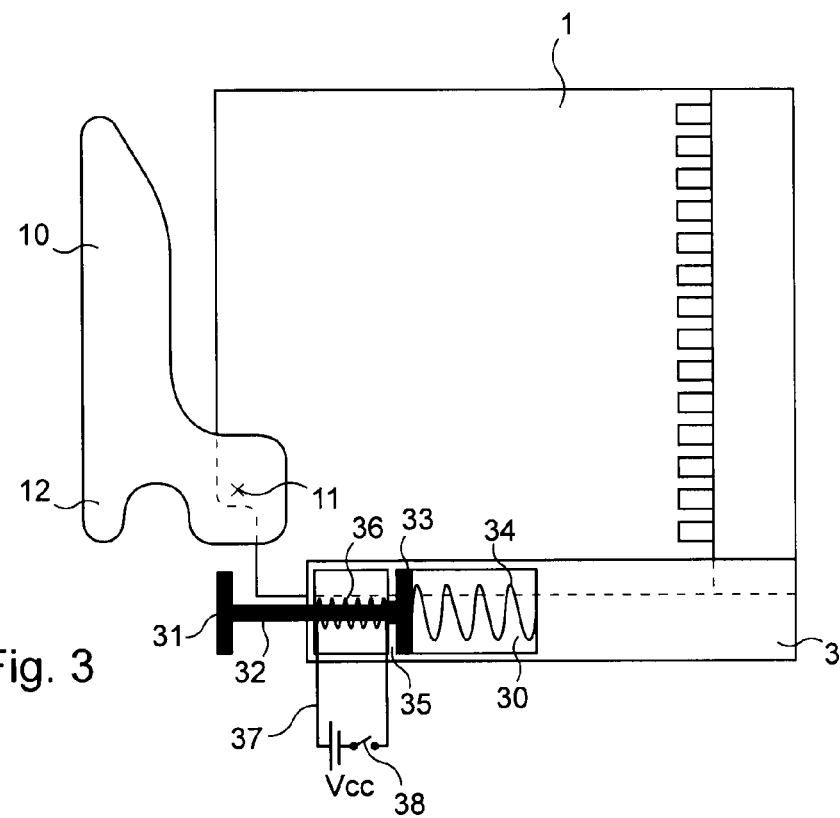
FIG. 3 is a side view of an alternative embodiment of an extraction device for an electronic card according to the invention.

An alternative embodiment is shown on FIG. 3.

According to the same principle as set forth on FIGS. 2a and 2c, in this embodiment a support device 30 is installed in base 3. This device comprises a support plate 31 integral with a rod 32 installed translatably in base 3 and integral with its end opposite a stop plate 33. A spring 34 comes to rest on the free face of plate 33 so as to come to flatten the latter against two stops 35 projecting from base 3.

According to the same principle as set forth for FIGS. 2a to 2c, rod 32 has a ferromagnetic portion around which there is installed an electrical coil 36 connected to an electrical circuit 37 subjected to a DC voltage. The electrical circuit 37 may be interrupted with the aid of a switch 38. The ferromagnetic part of rod 32 and coil 36 jointly form an electromagnet.

In operation, device 30 has a rest position such as visible on FIG. 3, in which spring 34 comes to flatten stop plate 33 against stops 35, support plate 31 then being in a position referred to as support for end 12 of lever 10. If the latter came to be lowered while switch 38 is open, support plate 31 would retract into device 30 by compressing spring 34. The extraction lever then would not bear on support plate 31 and there would be no effect of movement for extraction of the card for lack of support surface.

When switch 38 is closed, coil 36 generates an electromagnetic field around the ferromagnetic part of shaft 32, thus blocking the assembly in translation, which immobilizes support plate 31. Lever 10 then may be lowered until its support end 12 comes to rest on support plate 31 from now on immobilized, and it then brings about a movement for extraction of the card through support on this plate in a manner similar to the extraction illustrated on FIGS. 2b and 2c.

Spring 34 and coil 36 forming an electromagnet with shaft 32 are sized so that a minimal voltage is required to block translation of the assembly when switch 38 is closed.

Figure 4:
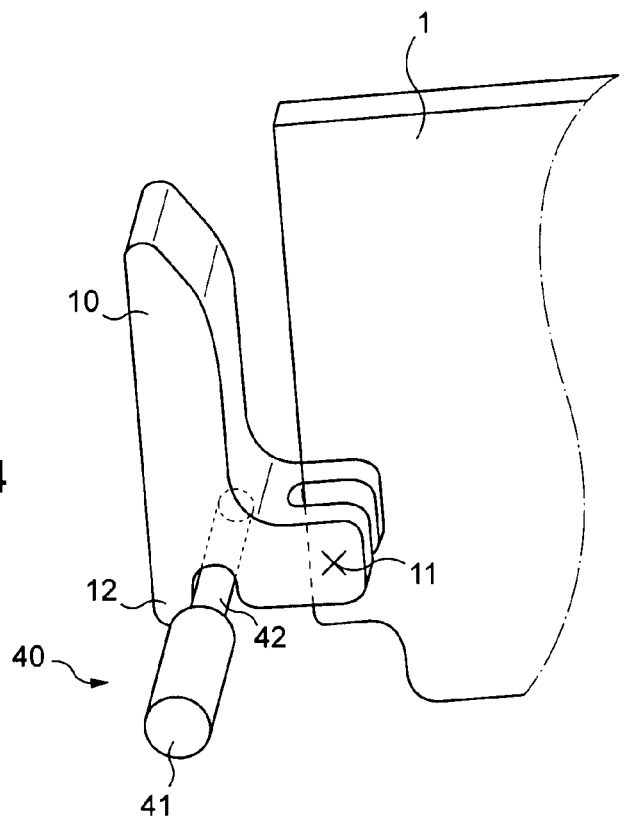
FIG. 4 is a side view of another embodiment of an extraction device for an electronic card according to the invention.

Another embodiment is shown schematically on FIG. 4. In this embodiment, an electronic card 1 similar in every respect to the electronic cards such as described above and having a lever 10 with a support end 12 is adapted for cooperating with a locking mechanism 40. The latter has a lock 41 fastened to a base, not shown, and in which a slot is provided to accommodate electronic card 1 in a manner analogous to the embodiments described above. It is a matter of an electromagnetic lock connected to an electrical circuit, not shown, and similar in every respect to the electrical circuit described above. Electromagnetic lock 41 has a feeler gauge 42 controlled in translation by an electromagnet shown disposed inside the lock. The locking mechanism 40 is fastened onto the base (not shown) at the level of support end 12 of the lever, when card 1 is inserted therein. The feeler gauge 42 is adapted for moving in translation between a first position in which it is retracted completely into the body of lock 41 and a second position, such as shown on FIG. 4, in which the feeler gauge is in the path of support end 12 when the lever pivots around pivot 11. Feeler gauge 42 then serves as support element for support end 12 of the lever, then bringing about a movement for extraction of the card in a manner analogous to the extraction shown on FIGS. 2b and 2c. In an embodiment not shown, the lock is fastened in a machining provided for this purpose on the base.

According to an advantageous aspect of the invention able to be applied to all the embodiments described above, in a device comprising a plurality of interconnected electronic cards (not shown), visual indication means are provided on the card or close thereto in order to indicate to the operator that the support means are activated. It is a matter, for example, of a light-emitting diode connected to the power supply circuit of the electromagnet and which indicates whether the latter is carrying current.

According to the embodiments, the operator knows, depending on whether the diode is on or off, whether the card is ready to be extracted.

In practice, the switches of the power supply circuits of the embodiments of the invention described above are controlled by a control device 50 for the extraction of electronic cards. In a device comprising a plurality of interconnected electronic cards 52, this control device 50 is adapted for receiving from the operator an extraction request for a given electronic card, and for then reconfiguring the other cards so that the latter provide the function or functions of the card to be extracted. The device then sends a signal to the corresponding switch of the card to activate the support means and cause them to change over to a state in which the lever bears on the support element. At the same time, if a visual indicator 51 is present, the latter is swung to a state in which it indicates to the operator that the chosen card is ready to be extracted.

In practice, the operator sends out an extraction request for a given card on the control device 50. He then identifies, with the aid of the visual indicator 51, that the card in question is ready to be extracted and, the support means being activated, he acts on the lever so as to cause it to change over from the first to the second position such as described above in order to extract the card in question.

Numerous other variants are possible according to circumstances, and in this regard it is recalled that the invention is not limited to the examples described and shown.

The invention claimed is:

1. A base for an electronic card comprising:
a support element; and
at least one slot disposed adjacent the base that accommodates the electronic card, the electronic card having an extraction lever installed rotatably thereon, the extraction lever being pivotable between a first lever position and a second lever position, the extraction lever having a support end disposed so as to rest on the support element of the base in order to extract the electronic card from the base when the extraction lever changes from the first lever position to the second lever position,
wherein in a first state, the extraction lever does not bear on the support element when changing from the first lever position to the second lever position,
wherein in a second state, the extraction lever bears on the support element when changing from the first lever position to the second lever position, and
wherein rotation of the extraction lever from the first lever position to the second lever position creates a movement for extraction of the electronic card through support of the support end of the extraction lever on the support element along a support direction.

2. The base according to claim 1, wherein the support element is free in translation along the support direction, and
wherein the change from the first state to the second state is accomplished via a mechanical blockage of the support element in translation in a position in which the support end of the extraction lever bears on the support element during rotation of the extraction lever from the first lever position to the second lever position which creates the movement for extraction of the electronic card.

3. The base according to claim 1, wherein the support element is movable between a first support position in which the support element is not in a path of the support end of the extraction lever when the extraction lever changes from the first lever position to the second lever position, and a second support position in which the support element is in the path of the support end of the extraction lever, and
wherein the change from the first state to the second state is accomplished by a movement and a mechanical blockage of the support element from the first support position to the second support position.

4. The base according to claim 2, wherein the support element is movable in translation along the support direction.

5. The base according to claim 3, wherein the support element is movable along a direction substantially perpendicular to the support direction.

6. The base according to claim 2, wherein the mechanical blockage is accomplished, at least in part, via an electromagnet.

7. The base according to claim 1, further comprising a lock mechanism that houses the support element, the support element being completely retracted within the lock mechanism in the first state and extended in the second state.

8. The base according to claim 7, wherein the support element extends and retracts in a direction perpendicular to the support direction.

9. An extraction device comprising:
at least one electronic card including an extraction lever having a support end; and
the base of claim 1,
wherein the support end is adapted for resting on the support element and the base.

10. The extraction device according to claim 9, further comprising:
  a plurality of interconnected electronic cards; and
  control means adapted for:
    receiving an extraction request for a specific electronic card of the plurality of interconnected electronic cards,
    reconfiguring the plurality of interconnected electronic cards, except for the specific electronic card, so as to provide a function or functions of the specific electronic card,
    sending a signal to an electromagnet of the base securing the specific electronic card to change from the first state to the second state, and
    indicating by a visual indicator that the specific electronic card is ready to be extracted.

11. A method for extraction of the electronic card via the extraction device according to claim 10, comprising the steps of:
  sending out an extraction request for the specific electronic card,
  identifying via the visual indicator that the specific electronic card is ready to be extracted, and
  extracting the specific electronic card by changing the extraction lever from the first lever position to the second lever position.

12. An aircraft comprising the extraction device according to claim 10.

* * * * *